United States Patent
Choe et al.

Patent No.: US 6,262,601 B1
Date of Patent: Jul. 17, 2001

(54) INVERTER FOR HIGH VOLTAGE FULL SWING OUTPUT

(75) Inventors: Jeong-Ae Choe, Kyongsangbuk-do; Jeen-Mo Yang, Taegu, both of (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/484,040

(22) Filed: Jan. 18, 2000

(30) Foreign Application Priority Data

Jun. 25, 1999 (KR) .................................................. 99-24160

(51) Int. Cl.[7] .............................................. H03K 19/094
(52) U.S. Cl. .......................... 326/121; 326/119; 326/68; 326/86
(58) Field of Search .................................. 326/68, 83, 86, 326/87, 104, 106–108, 112, 119–121

(56) References Cited

U.S. PATENT DOCUMENTS

| 5,465,054 | 11/1995 | Erhart | 326/34 |
| 5,604,449 | * 2/1997 | Erhart et al. | 326/81 |
| 5,939,932 | * 8/1999 | Lee | 327/436 |
| 6,031,395 | * 2/2000 | Choi et al. | 326/83 |
| 6,072,335 | * 6/2000 | Hughes | 326/83 |

* cited by examiner

Primary Examiner—Michael Tokar
Assistant Examiner—Vibol Tan
(74) Attorney, Agent, or Firm—Morgan, Lewis & Bockius LLP

(57) ABSTRACT

The present invention relates to an inverter for high voltage full swing output, for generating an inverter output changing into full swing corresponding to a supply voltage of a high voltage circuit which is m (integer) times higher than a supply voltage of a low voltage circuit, the inverter including a switching circuit having 2 m transistors stacked one upon another, a feedback control circuit supplying gates of the 2 m transistors of the switching circuit with a bias voltage by reducing a full swing inverter output voltage, and a shield voltage source generating a shield voltage to control transmission of the bias voltage.

9 Claims, 5 Drawing Sheets

INVERTER FOR HIGH VOLTAGE FULL SWING OUTPUT

This Application claims the benefit of Korean Patent Application No. 99-24160 filed on Jun. 25, 1999, which is hereby incorporated by reference.

BACKGROUND OF THE INVENTION

1. Field of the Invention

The present invention relates to an inverter for high voltage full swing output, and more particularly, to an inverter circuit which generates a full swing output in the range of zero volt (ground voltage) to a value of a high voltage source.

2. Discussion of the Related Art

As shown in FIG. 1, a high voltage inverter of related art includes a first super transistor SP and a second super transistor SN. The first super transistor SP consists of PMOS transistors P1 and P2. The second super transistor SN consists of NMOS transistors N1 and N2. The high voltage inverter is connected between a high voltage source HVDD and ground voltage GND (which is normally zero), and is operated by the high voltage source HVDD and a shield voltage source VSHLD (VSHLD=HVDD/2). The high voltage inverter received an input voltage HVin and generates an output voltage HVout.

More specifically, the inverter includes a PMOS P2 connecting Vp (see FIG. 1) and HVDD to its drain terminal and bulk terminal, respectively. A PMOS P3 connects Vp, HVout, and Vp to its source terminal, drain terminal, and bulk terminal, respectively. An NMOS N2 connects GND, Vn, and GND to its source terminal, drain terminal, and bulk terminal, respectively. An NMOS N3 connects Vn, HVout, and Vn to its source terminal, drain terminal, and bulk terminal, respectively. A PMOS P1 connects HVin, a gate input of the PMOS P2, and the same gate input of the PMOS P2 to its source terminal, drain terminal, and bulk terminal, respectively. An NMOS N1 connects HVin, a gate input of the NMOS N2, and the same gate input of the NMOS N2 to its source terminal, drain terminal and bulk terminal, wherein gates of the PMOS P1 and P3, and NMOS N3 and N1 are connected to VSHLD. The structure formed of P1 and P2 with drain of the P1 connected to gate input of the P2 consists the first super transistor SP, while the structure formed of N1 and N2 with drain of the N1 connected to gate input of the N2 consists the second super transistor SN.

In the high voltage inverter described above, the shield voltage source VSHLD has to be supplied with a voltage of 3.3 V when a voltage of 6.6 V is applied to the high voltage source HVDD. Once a high voltage of 6.6 V is applied to HVin, the P1 with its gate terminal connected to VSHLD becomes turned on while the N1 becomes turned off. Thus, drain terminal of the P1 is supplied with 6.6 V and source terminal of the N1 is supplied with 3.3 V–Vtn (where Vtn is a threshold voltage of n-type MOS transistor), turning off the P2 and P3 and turning on the N2 and N3. Therefore, 0 V is ouputted from the output terminal.

In this case, although a high voltage of 6.6 V is applied between the high voltage source and output terminal, each transistor operates within a low voltage level as the voltage of Vp is biased to 3.3+Vtp (where Vtp is a threshold voltage of p-type MOS transistor) by the shield voltage source VSHLD.

Otherwise, when 0 V is applied to the HVin, the P1 with its gate terminal connected to VSHLD becomes turned off while the N1 becomes turned on. Thus, a high voltage of 6.6 V is outputted from the output terminal by turning on the P2 and P3 but turning off the N2 and N3. In addition, the voltage of the drain terminal of the P1 and the voltage of Vn are biased to low voltage level by the shield voltage source VSHLD.

As a result, each of the transistors operates stably within the low voltage level due to the super transistors SP and SN and the shield voltage source VSHLD and enables a full-swing output between the high voltage source HVDD and ground GND.

However, the high voltage inverter of the related art as described above has the following disadvantages. The voltage level of the high voltage source (HVDD) of the inverter circuit can only be extended two times as high as the limit bias voltage of low voltage transistors used in the inverter circuit.

SUMMARY OF THE INVENTION

Accordingly, the present invention is directed to an inverter for high voltage full swing output that substantially obviates one or more of the problems due to limitations and disadvantages of the related art.

An object of the present invention is to provide an inverter for high voltage full swing output which extends the voltage level of the high voltage source of the inverter circuit to a level which is higher than two times of the limit bias voltage of low voltage transistors.

Another object of the present invention is to provide an inverter for high voltage full swing output which generates a full swing output ranging from a voltage of a high voltage source to a ground voltage. The inverter of the present invention also operates stably with a low voltage applied to each transistor to prevent transistors from voltage breakdown and the like, so that the low voltage process set up by the related art can be used even though a high voltage supply is applied to the overall inverter circuit.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an inverter for high voltage full swing output of the present invention generates an inverter output changing into full swing corresponding to supply voltage of a high voltage circuit wherein the supply voltage of a high voltage circuit is m of integer times higher than supply voltage of a low voltage circuit. The inverter of the present invention includes a switching circuit 10 consisting of 2 m transistors wherein the transistors are stacked one upon another, a feedback control circuit 30 supplying gates of the transistors of the switching circuit with bias voltage by reducing full swing inverter output voltage, and a shield voltage source generating shield voltage to control transmission of the bias voltage. The shield voltage source of the present invention includes a circuit having m PMOS transistors and m NMOS transistors which are connected in series, and wherein at least one high shield voltage HVshield and low shield voltage LVshield is generated from a joint interconnecting the transistors. The feedback control circuit of the present invention includes a serial circuit having m PMOS transistors and m NMOS transistors, and at least one passing transistor transmitting voltage of at least one transistor joint in the serial circuit to at least one gate of the stacked transistors of the switching circuit.

In another aspect of the present invention, an inverter for high voltage full swing output of the present invention generates an inverter output changing into full swing corresponding to supply voltage of a high voltage circuit wherein the supply voltage of a high voltage circuit is 3 times higher than supply voltage of a low voltage circuit. The inverter includes a switching circuit having a first to third PMOS transistors and a first to third NMOS transistors wherein the NMOS and PMOS transistors are stacked one another, a feedback control circuit supplying gates of the transistors of the switching circuit with bias voltage by reducing full swing inverter output voltage, and a shield voltage source generating shield voltage to control transmission of the bias voltage. The shield voltage source includes a serial circuit having a first to third PMOS transistors and a first to third NMOS transistors, wherein a high shield voltage is generated from a joint between the second and third PMOS transistors, and wherein a low shield voltage is generated from a joint between the second and third NMOS transistors. The feedback control circuit includes a serial circuit having a first to third PMOS transistors and a first to third NMOS transistors, a first passing NMOS transistor of which source is connected to a joint between the second and third PMOS transistors, of which drain is connected to a gate of the third PMOS transistor in the switching circuit, and of which gate is connected to shield voltage, and a first passing PMOS transistor of which source is connected to a joint between the second and third NMOS transistors, of which drain is connected to a gate of the third NMOS transistor in the switching circuit, and of which gate is connected to shield voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the inventing and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
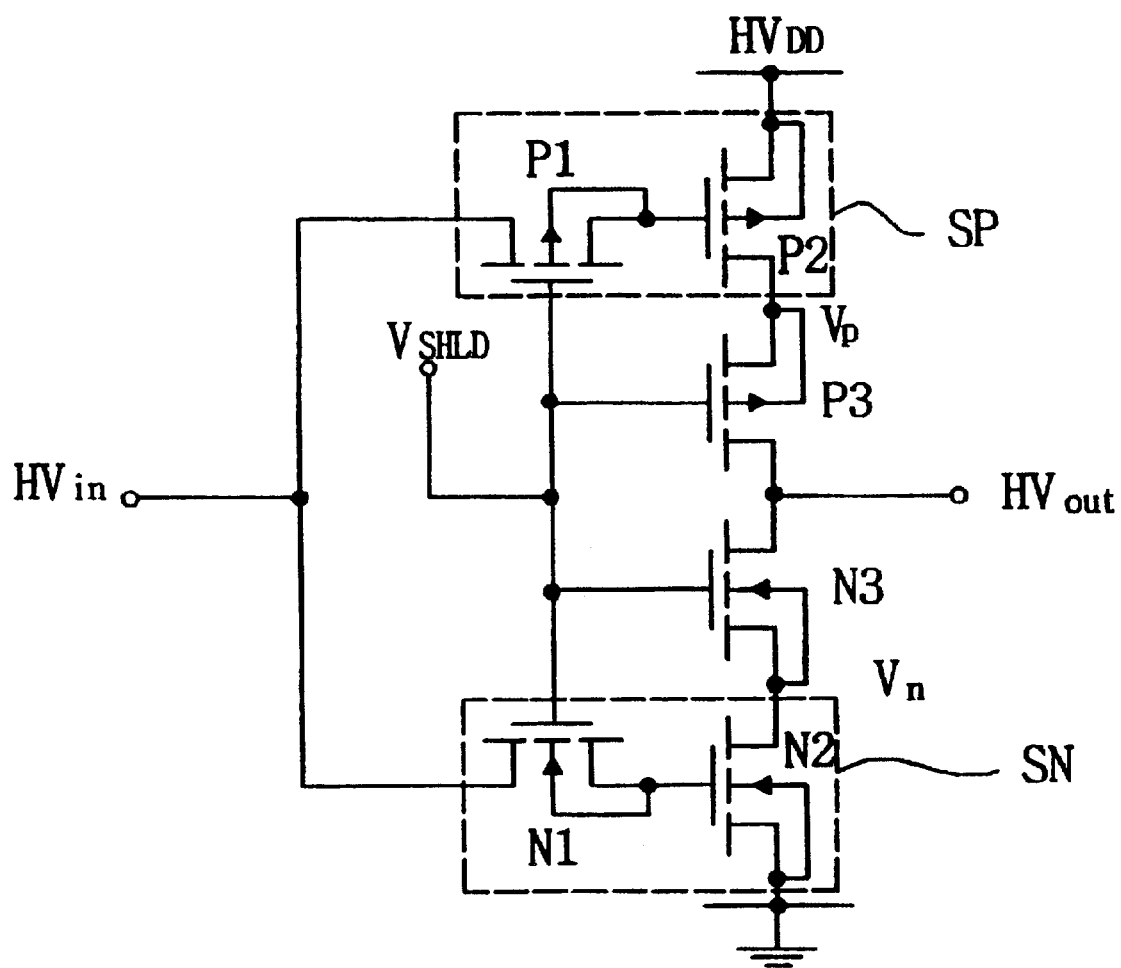
FIG. 1 shows an inverter circuit for high voltage full swing output according to a related art.
Figure 2:
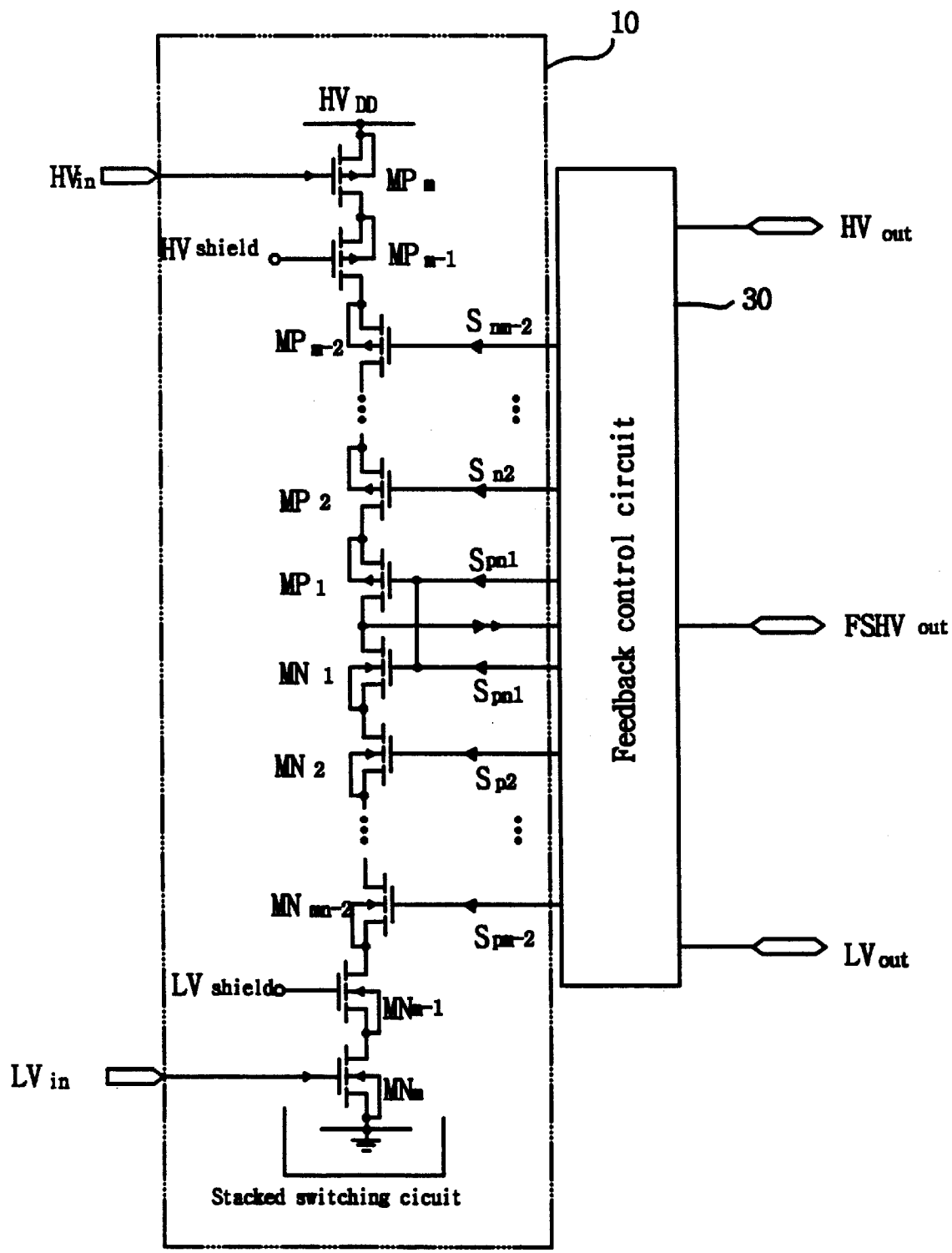
FIG. 2 shows an inverter circuit for high voltage full swing output according to the present invention.
Figure 4:
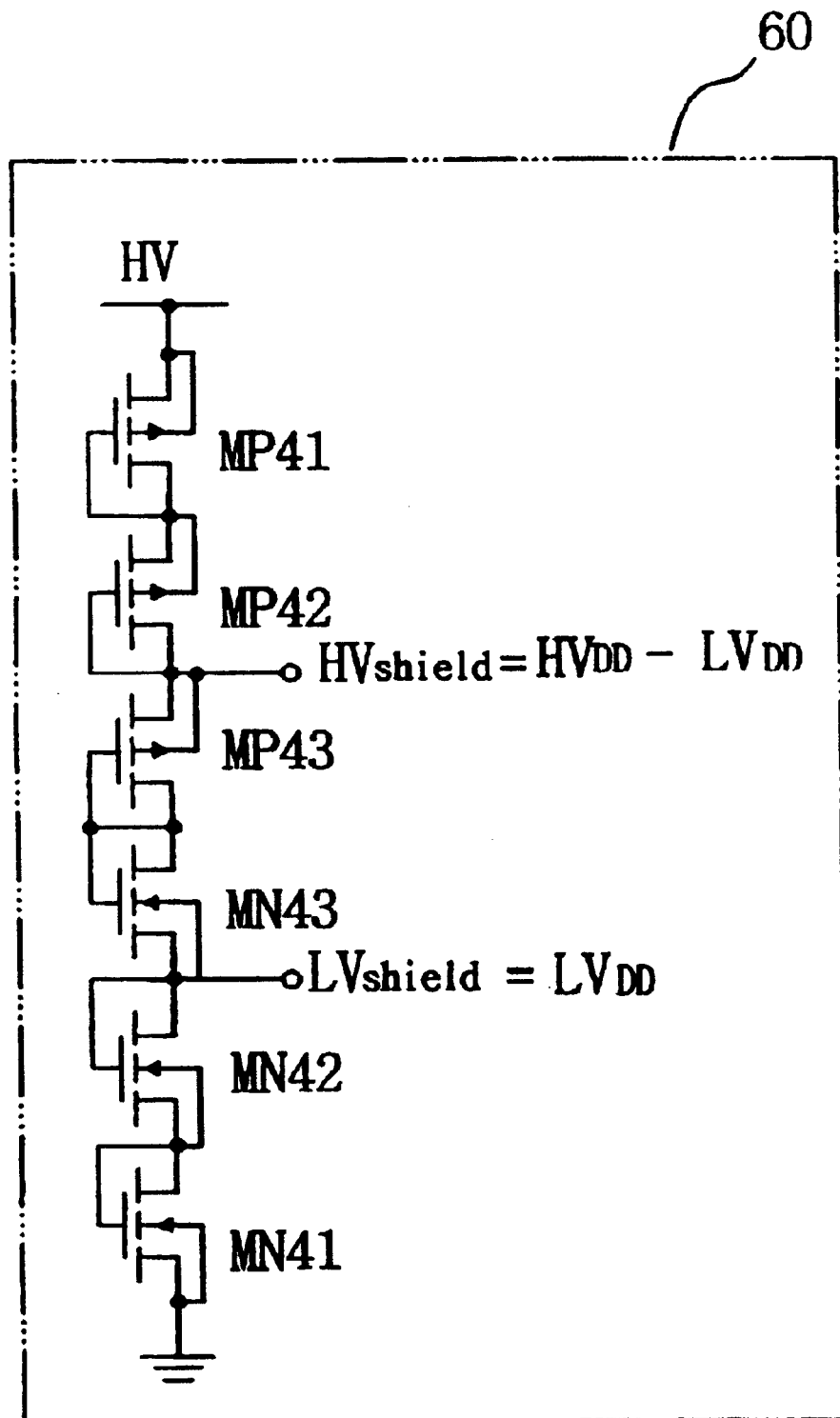
FIG. 4 shows a circuit including a shield voltage source in FIG. 3.

FIG. 2 shows an inverter circuit for high voltage full swing output according to the present invention. Referring to FIG. 2, an inverter for high voltage full swing output of the present invention includes a stacked switching circuit 10, a feedback control circuit 30, and a shield voltage source 60 (not shown in FIG. 2, but an example is illustrated in FIG. 4). The inverter circuit outputs high voltage output signals HVout and FSHVout and a low voltage output signal LVout by receiving high voltage source HVDD, ground voltage GND, a high voltage input signal HVin, and a low voltage input signal LVin.

The stacked switching circuit 10 includes main switching transistors MPm and MNm; shield-switching transistors MPm−1 and MN−1 for biasing the voltage between each of the transistor terminals to stabilized low voltage by receiving high shield voltage HVshield and low shield voltage LVshield of the shield voltage source 60, and a plurality of shield-switching transistors MP1−MPm−2 and MN1−MNm−2 for biasing the voltage between each of the transistor terminals to stabilized low voltage by receiving a control signal generated from the feedback control circuit 30.

The number of the transistors stacked in series in the stacked switching circuit 10 is determined by a stacking ratio in formula (1) as described below. The high voltage output FSHVout is decided by the switching operation of the main-switching transistors and the shield-switching transistors being turned on or off in accordance with the operations of the main-switching transistors.

m(stacking ratio)=HVDD (supply voltage of high voltage circuit)/ LVDD (supply voltage of low voltage circuit)  formula (1)

In addition, the high and low shield voltages calculated from formula (2) and (3) are applied to each gate of the transistors MPm−1 and Mnm−1, respectfully.

HVshield=HVDD−LVDD  formula (2)

LVshield=LVDD+GND  formula (3)

In order to prevent oxide voltage breakdown due to a high voltage bias between the gate and bulk terminals, a bulk terminal of a respective transistor is connected to its corresponding source terminal. Various junction breakdowns are prevented by supplying the maximum bias voltage between the terminals of the transistors, as shown in formula (4), with LVDD when the transistor is "ON" state or with low voltage of (LVDD±| Vto |) when the transistor is "OFF" state.

Vgs.gd.ds$|_{ID \neq 0'max}$=LVDD (ON state)

Vgs.gd.ds$|_{ID=0'max}$=GND−(LVDD±| Vto |) (OFF state)  formula (4)

For a n-type transistor, Vgs.gd.ds$|_{ID=0'max}$=GND−(LVDD−| Vto |) is used in "OFF" state, and for a p-type transistor, Vgs.gd.ds$|_{ID=0'max}$=GND−(LVDD+| Vto |) is used in "OFF" state.

In formula (4), Vgs.gd.ds is the gate-to-source voltage, gate-to-drain voltage, or drain-to-source voltage in a MOS transistor, ID is the drain current in a MOS transistor, GND is the ground voltage which is normally zero, and Vto is a threshold voltage of a MOS transistor when its substrate bias voltage Vsb is "0". In addition, Vgs.gd.ds$|_{ID \neq 0'max}$ is the maximum voltage among Vgs, Vgd and Vds when a transistor is in "ON" state, and Vgs.gd.ds$|_{ID=0'max}$ is the maximum voltage among Vgs, Vgd and Vds when a transistor is in "OFF" state.

The feedback control circuit 30 includes a part where transistors, of which gate and drain terminals are connected with one another, are connected in series in accordance with the stacking ratio and passing gates which let a required signal "pass" or "cut off".

The feedback control circuit 30 generates a signal S which protects "ON/OFF" operation of the protection-switching transistors and guarantees that voltage between the terminals ranges within low voltage level to secure stability. Simultaneously, the feedback control circuit 30 also produces a high voltage signal HVout and a low voltage signal LVout.

Figure 3:
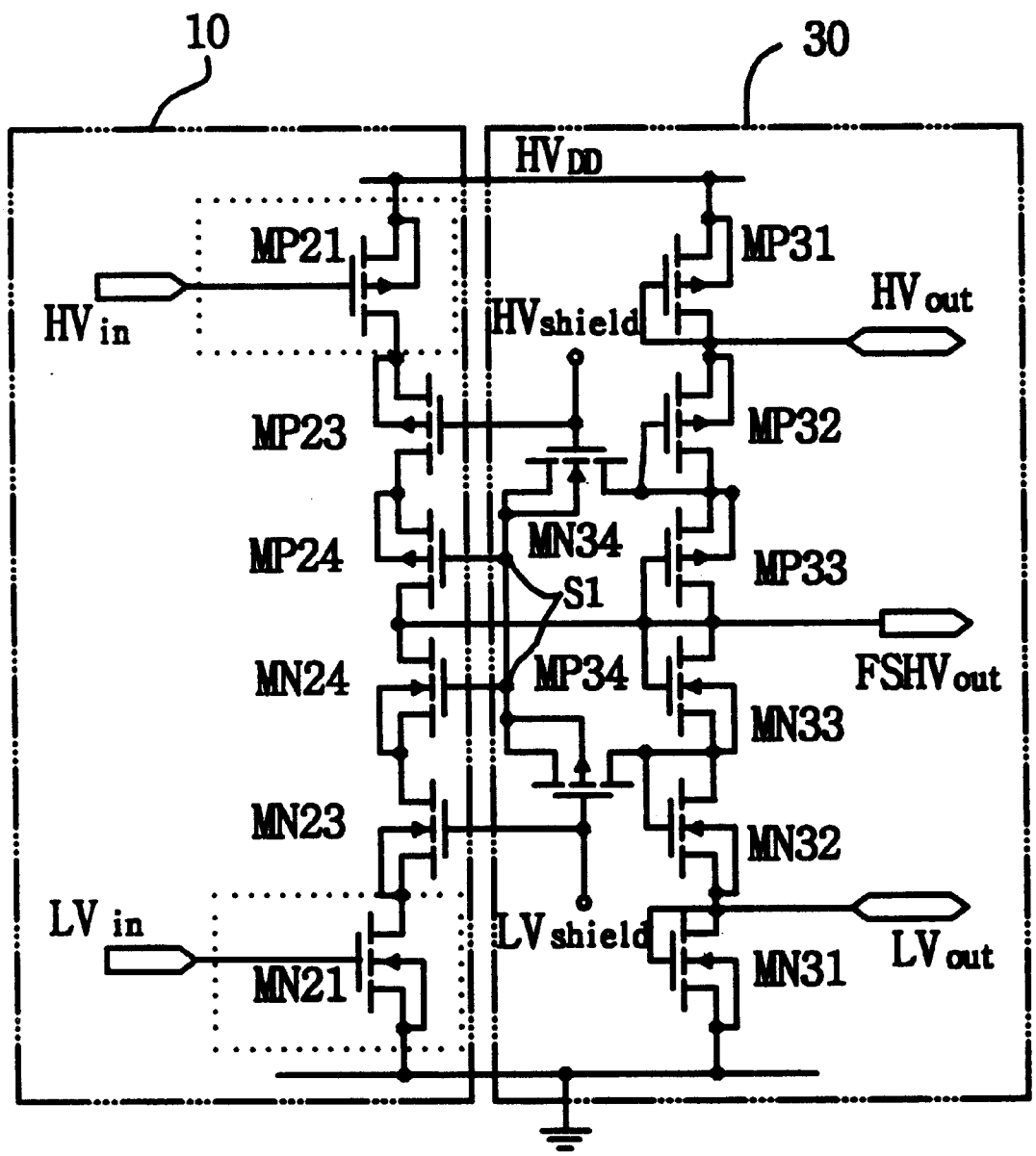
FIG. 3 shows a circuit according to an embodiment of the present invention wherein stacking ratio is 3.

FIG. 3 shows a circuit according to an embodiment of the present invention wherein the stacking ratio is 3.

Referring to FIG. 3, in a stacked switching circuit 10 of the inverter circuit, main-switching transistors including a first PMOS transistor MP21 and a first NMOS transistor MN21, and shield-switching transistors including a second PMOS transistor MP23, a second NMOS transistor MN23, a third PMOS transistor MP24, and a third NMOS transistor MN24, are connected in series between HVDD and ground voltage.

In the main-switching transistor MP21, its bulk terminal is connected to a high voltage source HVDD and its gate is connected to a high voltage input signal HVin. In the other main-switching transistor MN21, its bulk terminal is connected to the ground and its gate is connected to a low voltage input signal LVin. In the shield-switching transistors MP23, MP24, MN23, and MN24, their bulk terminals are connected to various sources as shown in FIG. 3. Drains of the MP24 and MN24 are connected in common, outputting a full swing output signal FSHVout of high voltage.

A feedback control circuit 30 includes a first PMOS transistor MP31, a second PMOS transistor MP32, a third PMOS transistor MP33, a passing transistor MP34, a first NMOS transistor MN31, a second NMOS transistor MN32, a third NMOS transistor MN33, and another passing transistor MN34.

A bulk terminal and gate of the MP31 are connected to its source and drain, respectively. A bulk terminal and gate of the MP32 are connected its a source and drain, respectively. A high voltage output signal HVout is outputted from ajoint between the drain of the MP31 and the source of the MP32.

A bulk terminal and gate of the MN31 are connected to its source and drain, respectively. A bulk terminal and gate of the MN32 are connected to its source and drain, respectively. A low voltage output signal LVout is outputted from ajoint between the drain of the MN31 and the source of the MN32.

The source of MP33 is connected to the drain of the MP32. A bulk terminal of MP33 is connected to its source and its gate is connected to its drain. The source of MN33 is connected to the drain of the MN32, a bulk terminal and gate of MN33 are connected to its source and drain, respectively. The full swing high voltage output signal FSHVout is outputted from ajoint between the drains of the MP33 and MN33.

The passing transistor MN34 works as a switching transistor which transmits the voltage at the joint between the drain of the MP32 and the source of the MP33 to the gate of the MP24. A drain of the MN34 is connected to the joint between the drain of the MP32 and the source of the MP33. And, a source of the MN34 is connected to the gate of the MP24. The gates of the passing transistor MN34 and the MP23 are commonly connected to a high shield voltage HVshield of a voltage shield source 60 (to be described later).

The other passing transistor MP34 works as a switching transistor which transmits the voltage at the joint between the drain of the MN32 and the source of the MN33 to the gate of the MN24. A drain of the MP34 is connected to the joint between the drain of the MN32 and the source of the MN33. A source of the MP34 is connected to the gate of the MN24. The gates of the passing transistor MP34 and the MN23 are commonly connected to a low shield voltage LVshield of the As shown in FIG. 4, the shield voltage source 60 is connected between the high voltage source HVDD and ground, and is a serial circuit including transistors MP41, MP42, MP43, MN43, MN42, and MN41. The shield voltage source 60 generates high shield voltage HVshield from ajoint between the drain of the MP42 and the source of the MP43 and generates low shield voltage LVshield from a joint between the drain of the MN42 and the source of the MN43.

The operation of the embodiment consisting of the above elements will be explained in the following description.

Once a voltage of 10 V is applied to the high voltage source HVDD as shown in FIG. 4, the high shield voltage HVshield of 6.6 V and low shield voltage LVshield of 3.3 V from the shield voltage source 60 are applied to the respective joints of the circuit in FIG. 3, respectively.

When low input signal L Vin and high input signal HVin are supplied with 0~3.3 V and 6.6~10V,respectively, a high voltage output terminal FSHVout outputs signals in the full-swing range of 10 to 0V. In order for the shield-switching transistors to operate stably, the S1 is generated from the feedback control signal as shown in the following description.

Once FSHVout is 10V,source terminals of the MP33 and MN33 become 10 and 6.6V,respectively. The S1 node received 6.6V as the passing transistor MN34 and the MP34 become "cut-off" and "passing" state by the source voltage, respectively.

Once FSHVout is 0V, the source terminals of the MN33 and MP33 became 0V. Thus, the MP34 and MN34 become "cut-off" and "passing" state,respectively. Tn, a signal having a level of 6.6 to 3.3V is generated as the S1 node is supplied with 3.3V.

As a result of the above operations, the drains of the first PMOS and NMOS transistors MP21 and MN21 generate high and low voltage output varying within a fixed range, respectively. And, a full swing output varying from ground to high voltage level is generated from the drain joint between the third PMOS and NMOS transistors MP24 and MN24. In this case, the phases of the three outputs coincide one another.

Figure 5:
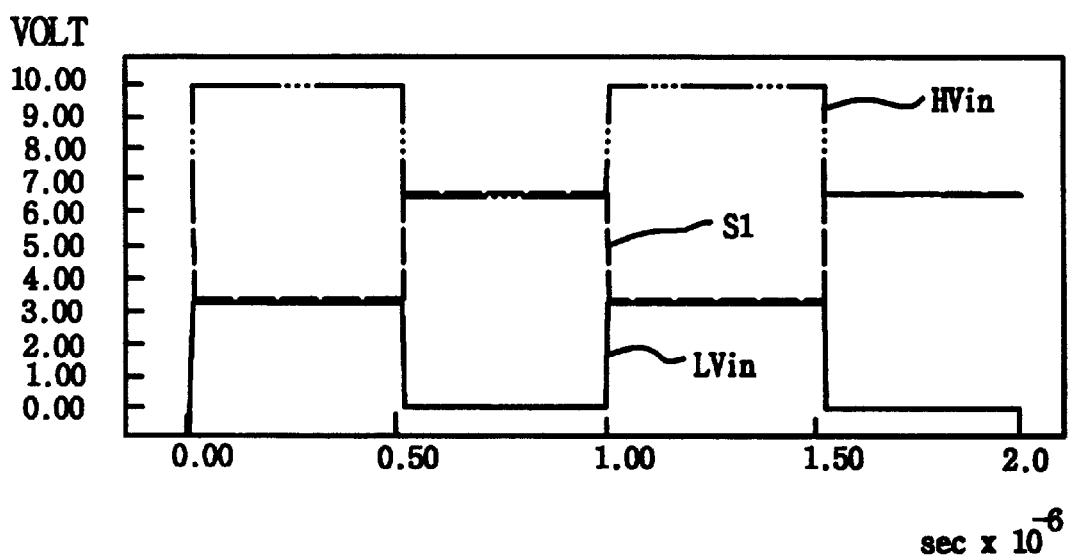
FIG. 5 shows input wave forms according to the embodiment of the present invention.
Figure 6:
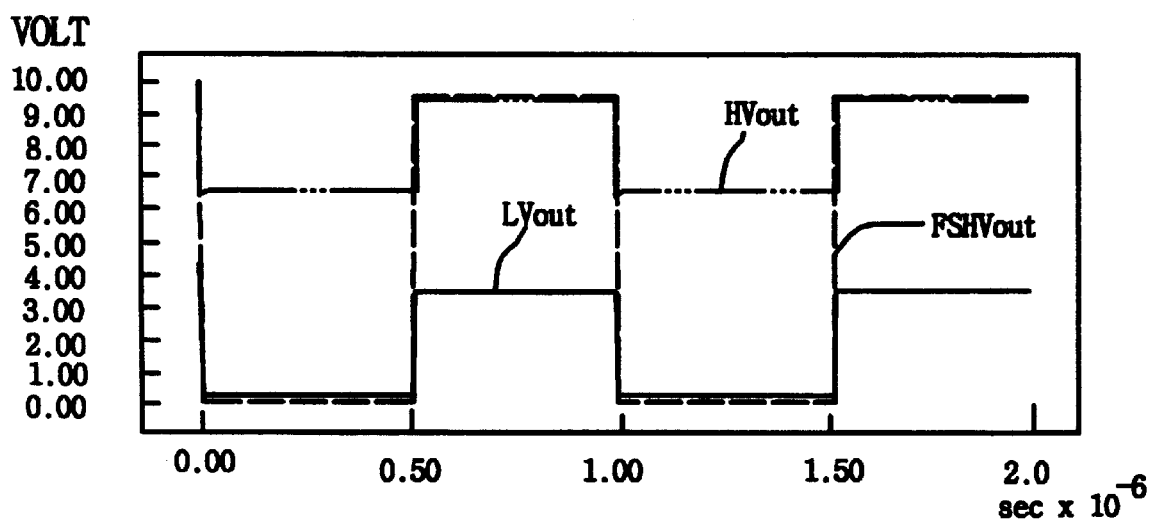
FIG. 6 shows output wave forms according to the embodiment of the present invention.

The above-mentioned operational states are shown in FIG. 5 as waveforms. FIG. 5 shows input waveforms of the stacked inverter for high voltage full swing output, where m=3, and FIG. 6 shows output waveforms of the stacked inverter for high voltage full swing output, where m=6. More specifically, an S1 signal, HVin signal, LVin signal, FSHVout output signal, HVout output signal, and LVout output signal are shown in FIG. 5 and FIG. 6.

The high voltage inverter circuit of the present invention has the following advantages. It can be fabricated by the low voltage process which is set up previously by the related art. Each transistor fabricated by the low voltage process of the related art is supplied with a low voltage so as to operate stably though a high voltage is applied to the overall circuit. As the designing method of the present invention is based on the standard CMOS digital circuit design, supporting-switching transistors are stacked in accordance with stacking ratio required for the basic inverter structure. Therefore, the principle of the present invention can be extended to the study of circuit design which requires stacking ratio equal to or higher than m=4. Accordingly, the present invention is capable of extending the voltage level of the high voltage source of the inverter circuit to a level higher than twice of the bias voltage of low voltage transistors.

In addition, the present invention is capable of generating a full swing output ranging from high voltage source to ground while operating stably by applying low voltage to each transistor and preventing each transistor from voltage breakdown. Moreover, the present invention operates under a high voltage supply while utilizing the low voltage process which is set up by the related art.

Furthermore, in utilizing the low voltage process which is set up by the related art and the method of stacking MOS-FETs in an ordinary CMOS inverter circuit, the present invention can be applied to systems which require high voltages such as LCD, CD-ROM, and the like used for a notebook computer by using a design that operates stably under a high voltage supply and disperse high voltage HVDD such as 10 to 15V into low voltage LDD such as 3.3 to 5V to be applied to the respective transistors.

It will be apparent to those skilled in the art that various modifications and variations can be made in the inverter for high voltage full swing output of the present invention without departing from the spirit or scope of the invention. Thus, it is intended that the present invention cover the modifications and variations of this invention provided they come within the scope of the appended claims and equivalents.

What is claimed is:

1. An inverter for high voltage full swing output, for generating an inverter output changing into full swing corresponding to a supply voltage of a high voltage circuit which is m (integer) times higher than a supply voltage of a low voltage circuit, the inverter comprising:

a switching circuit including 2 m transistors stacked one upon another;

a feedback control circuit supplying gates of the 2 m transistors of the switching circuit with a bias voltage by reducing a full swing inverter output voltage; and a shield voltage source generating a shield voltage to control transmission of the bias voltage.

2. The inverter according to claim 1, wherein the shield voltage source includes a circuit having m PMOS transistors and m NMOS transistors connected in series, and wherein at least one of a high shield voltage (HVshield) and a low shield voltage (LVshield) is generated from a joint interconnecting the m PMOS transistors and the m NMOS transistors.

3. The inverter according to claim 1, wherein the feedback control circuit further comprises:

a serial circuit including m PMOS transistors and m NMOS transistors; and at least one passing transistor transmitting a voltage of at least one transistor joint in the serial to at least one gate of the 2 m transistors of the switching circuit.

4. An inverter for high voltage full swing output, for generating an inverter output changing into full swing corresponding to a supply voltage of a high voltage circuit which is 3 times higher than a supply voltage of a low voltage circuit, the inverter comprising:

a switching circuit including first to third PMOS transistors and first to third NMOS transistors wherein the NMOS and PMOS transistors are stacked one upon another;

a feedback control circuit supplying gates of the NMOS and PMOS transistors of the switching circuit with a bias voltage by reducing a full swing inverter output voltage; and a shield voltage source generating a shield voltage to control transmission of the bias voltage.

5. The inverter according to claim 4, wherein the shield voltage source includes a serial circuit including fourth to sixth PMOS transistors and fourth to sixth NMOS transistors, wherein a high shield voltage is generated from a joint between the fifth and sixth PMOS transistors, and wherein a low shield voltage is generated from a joint between the fifth and sixth NMOS transistors.

6. The inverter according to claim 5, wherein a bulk terminal is connected to a source terminal and a gate is connected to a drain terminal in each of the fourth to sixth PMOS and NMOS transistors.

7. The inverter according to claim 4, wherein the feedback control circuit further comprises:

a serial circuit including fourth to sixth PMOS transistors and fourth to sixth NMOS transistors;

a first passing NMOS transistor with a source terminal connected to a joint between the fifth and sixth PMOS transistors, with a drain terminal connected to a gate of the third PMOS transistor in the switching circuit, and with a gate connected to the shield voltage; and a first passing PMOS transistor with a source terminal connected to a joint between the fifth and sixth NMOS transistors, with a drain terminal connected to a gate of the third NMOS transistor in the switching circuit, and with a gate connected to the shield voltage.

8. The inverter according to claim 7, wherein a bulk terminal is connected to a source terminal and a gate is connected to a drain terminal in each of the fourth to sixth PMOS and NMOS transistors.

9. The inverter according to claim 7, wherein a high voltage output varying within a first fixed range is generated from a drain terminal of the fourth PMOS transistor, wherein a low voltage output varying within a second fixed range is generated from a drain terminal of the fourth NMOS transistor, wherein a full swing output varying from a ground level to a high voltage is generated from a joint between the drains of the sixth PMOS and the sixth NMOS transistors, and wherein phases of the high voltage output, the low voltage output, and the full swing output coincide.

* * * * *